(12) United States Patent
Duan

(10) Patent No.: US 9,726,698 B2
(45) Date of Patent: Aug. 8, 2017

(54) BIDIRECTIONAL VOLTAGE DIFFERENTIATOR CIRCUIT

(71) Applicant: STMicroelectronics (Shenzhen) R&D Co. Ltd, Shenzhen (CN)

(72) Inventor: Yijun Duan, Shenzhen (CN)

(73) Assignee: STMicroelectronics (Shenzhen) R&D Co. Ltd, Shenzhen (CN)

( * ) Notice: Subject to any disclaimer, the term of this patent is extended or adjusted under 35 U.S.C. 154(b) by 0 days.

(21) Appl. No.: 14/966,129

(22) Filed: Dec. 11, 2015

(65) Prior Publication Data

US 2016/0100468 A1 Apr. 7, 2016

Related U.S. Application Data

(62) Division of application No. 13/648,412, filed on Oct. 10, 2012, now Pat. No. 9,366,701.

(30) Foreign Application Priority Data

Dec. 31, 2011 (CN) .......................... 2011 1 0461949
Jul. 27, 2012 (CN) .......................... 2012 1 0268942

(51) Int. Cl.
*H03L 7/00* (2006.01)
*G01R 19/12* (2006.01)
(Continued)

(52) U.S. Cl.
CPC ....... *G01R 19/12* (2013.01); *G01R 19/16557* (2013.01); *H05B 33/0845* (2013.01); *H05B 33/0887* (2013.01)

(58) Field of Classification Search
USPC .......... 327/142, 143, 530–546; 323/312–317
See application file for complete search history.

(56) References Cited

U.S. PATENT DOCUMENTS 6,134,123 A * 10/2000 Yamada ............ H02M 3/33507
363/21.13
6,813,525 B2 11/2004 Reid et al.
(Continued)

OTHER PUBLICATIONS

Delbruck, Tobi et al: "Bias Current Generators With Wide Dynamic Range," Telluride Neuromorphic Engineering Worshiop, 1999 (4 pages).
(Continued)

*Primary Examiner* — Brandon S Cole
(74) *Attorney, Agent, or Firm* — Gardere Wynne Sewell LLP

(57) ABSTRACT

A bidirectional voltage differentiator circuit comprises start-up circuitry, sensing circuitry, and output circuitry coupled to logic circuitry. The start-up circuitry acts to start-up the sensing circuitry when the circuit is powered on, and accelerates the response of the sensing circuitry thereafter. The sensing circuitry senses variation in an input voltage applied to an input node. Responsive to the voltage variation sensed by the sensing circuitry, the output circuitry produces a state change at a first or second output node. The logic circuitry receives the states of the output nodes and produces a logic output signal to indicate the occurrence of the variation sensed in the input voltage. The voltage sensing circuit is operable to sense variation of the input voltage regardless of whether the voltage is rising or falling and without regard to the DC value of the input voltage.

30 Claims, 6 Drawing Sheets

(51) Int. Cl.
*G01R 19/165* (2006.01)
*H05B 33/08* (2006.01)

(56) References Cited

U.S. PATENT DOCUMENTS

| | | | |
|---|---|---|---|
| 8,264,262 B2 | 9/2012 | An | |
| 2004/0212409 A1* | 10/2004 | Akamatsu | H03K 17/223 327/143 |
| 2008/0055996 A1* | 3/2008 | Kim | G11C 16/32 365/185.18 |
| 2010/0148737 A1* | 6/2010 | Li | H02M 3/1588 323/282 |
| 2011/0115770 A1* | 5/2011 | Seo | G09G 3/32 345/211 |
| 2012/0119718 A1* | 5/2012 | Song | H02M 3/1588 323/282 |
| 2012/0154028 A1 | 6/2012 | Kim et al. | |
| 2012/0176167 A1* | 7/2012 | Lee | G06F 1/24 327/143 |
| 2012/0256664 A1* | 10/2012 | Gunther | H03K 17/223 327/143 |
| 2013/0009635 A1* | 1/2013 | Taylor | G01R 33/028 324/244 |
| 2013/0293270 A1* | 11/2013 | Lee | H03K 5/00006 327/113 |
| 2014/0035662 A1* | 2/2014 | Kang | G05F 5/00 327/536 |

OTHER PUBLICATIONS

Oguey, H., et al: "CMOS Current Reference Without Resistance," Swiss Center for Micro-Electronics and Microtechnology (CSEM), 1997 (4 pages).

Van Schaik, Andre, et al: A Bias-Current-Generators Toolkit, Institute of Neuromorphic Engineering, 'The Neuromorphic Engineer' publication No. 10.2417/1200411.0015 (2 pages), copyright 2004.

* cited by examiner

BIDIRECTIONAL VOLTAGE DIFFERENTIATOR CIRCUIT

CROSS-REFERENCE TO RELATED APPLICATIONS

This application is a divisional application from U.S. application for patent Ser. No. 13/648,412 filed Oct. 10, 2012, which claims priority from Chinese Application for Patent No. 201110461949.8 filed Dec. 31, 2011 and from Chinese Application for Patent No. 201210268942.9 filed Jul. 27, 2012, the disclosures of which are hereby incorporated by reference.

BACKGROUND

Technical Field

The present invention relates generally to voltage sensing circuitry and, more particularly, to an integrated circuit operable to sense bidirectional variation of an input voltage and produce an output signal indicating the occurrence of said voltage variation.

Introduction

Traditional voltage sensing circuits require circuitry for sensing a first voltage variation in one direction (e.g., rising) and additional circuitry for sensing a second voltage variation in another direction (e.g., falling). The additional circuitry required to sense a voltage change reduces efficiency of the circuit and requires additional components, thereby increasing manufacturing costs. Additionally, many traditional voltage sensing circuits consider a DC component of the sensed voltage, which may otherwise be unnecessary and further reduce efficiency of the circuit. Accordingly, there exists a need for voltage sensing circuitry with improved efficiency that may be manufactured at reduced expense.

SUMMARY

An integrated bidirectional voltage differentiator circuit is presented for sensing bidirectional variation of an input voltage and producing an output signal indicating the occurrence of said voltage variation. In one embodiment, the bidirectional voltage differentiator circuit comprises: first circuitry operable to sense a change in an input voltage; second circuitry operable, in response to said first circuitry sensing a first change in said input voltage, to change a state of a first logic signal and, in response to said first circuitry sensing a second change in said input voltage, to change a state of a second logic signal; and third circuitry operable, in response to a change in said first logic signal state or a change in said second logic signal state, to produce a third signal indicative of said first circuitry sensing said change in said input voltage.

In another embodiment, the bidirectional voltage differentiator circuit comprises: a voltage differentiator circuit operable to sense and respond to a positive change in an input voltage by increasing current applied to first circuitry operable to generate a state change of a first output signal, and further operable to sense and respond to a negative change in said input voltage by decreasing said current applied to said first circuitry operable to generate a state change of a second output signal; and second circuitry operable, in response to said first and second output signals, to produce a third signal indicative of a sensed change in said input voltage.

In yet another embodiment, the bidirectional voltage differentiator circuit comprises: a current generator circuit comprising: an input node capacitively coupled to a first circuit leg; a first internal output node coupled to said first circuit leg; and a second internal output node coupled to a second circuit leg; first pull-down circuitry having a first control node coupled to said first internal output node; second pull-down circuitry having a second control node coupled to said second internal output node; and logic circuitry coupled to said first pull-down circuitry at a first logic output node, and coupled to said second pull-down circuitry at a second logic output node.

The foregoing and other features and advantages of the present disclosure will become further apparent from the following detailed description of the embodiments, read in conjunction with the accompanying drawings. The detailed description and drawings are merely illustrative of the disclosure, rather than limiting the scope of the invention as defined by the appended claims and equivalents thereof.

BRIEF DESCRIPTION OF THE DRAWINGS

Embodiments are illustrated by way of example in the accompanying figures not necessarily drawn to scale, in which like reference numbers indicate similar parts, and in which.

DETAILED DESCRIPTION

Figure 1:
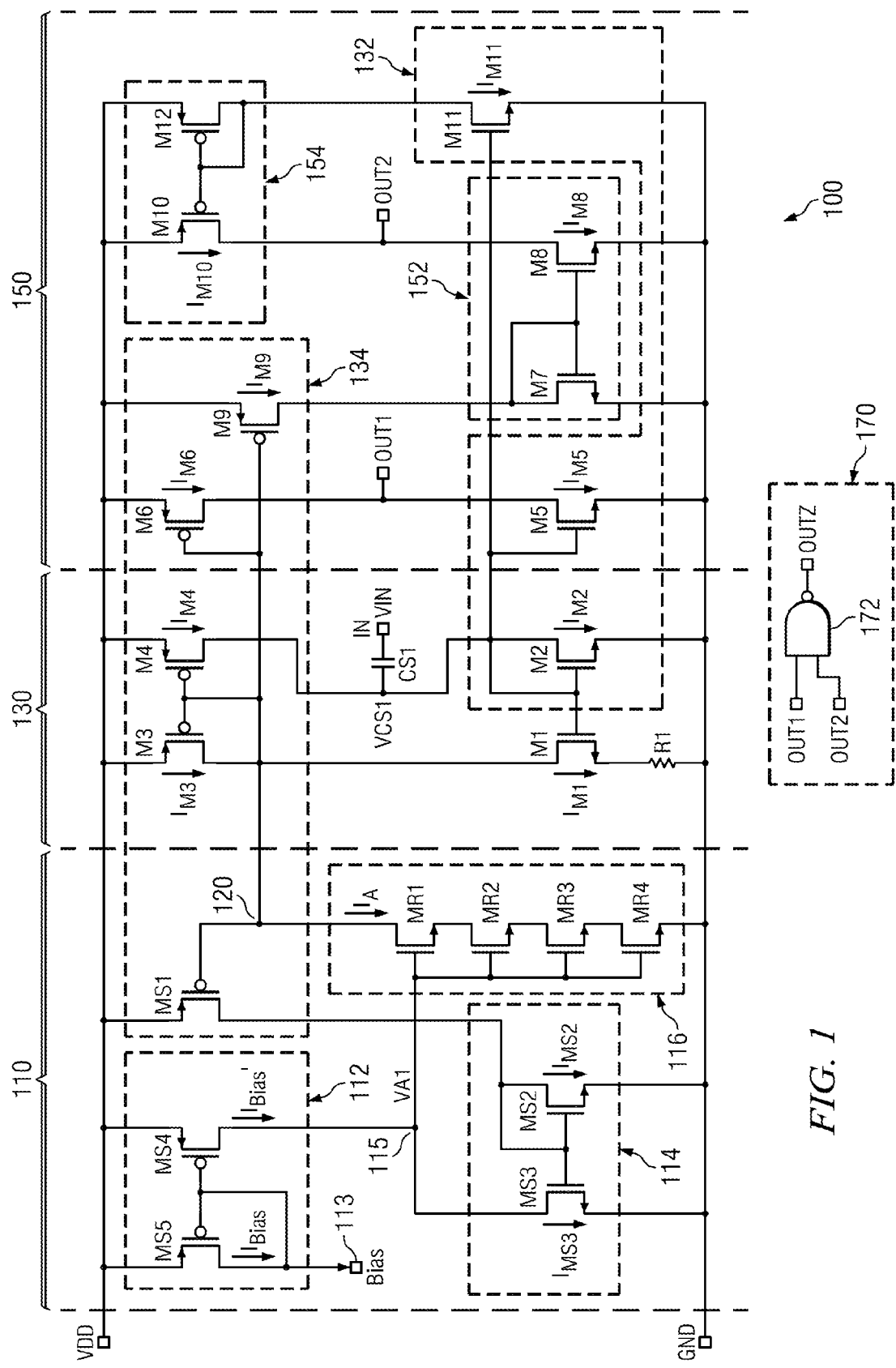
FIG. 1 illustrates a first example embodiment of a bidirectional voltage differentiator circuit in accordance with the present disclosure.

FIG. 1 illustrates a bidirectional voltage differentiator circuit 100 in accordance with an example embodiment of the present disclosure. The disclosed bidirectional voltage differentiator circuit 100 comprises start-up circuitry 110, sensing circuitry 130, and output circuitry 150 coupled to logic circuitry 170. The start-up circuitry 110 acts to start-up the sensing circuitry 130 in a current-generating state when the circuit 100 is powered on, and accelerates the response of the sensing circuitry 130 thereafter. The sensing circuitry 130 senses variation in an input voltage VIN applied to an input node IN. Responsive to the voltage variation sensed by the sensing circuitry 130, the output circuitry 150 produces a state change at a first output node OUT1 or at a second output node OUT2. The logic circuitry 170 receives the states of OUT1 and OUT2 and produces a logic output signal OUTZ to indicate the occurrence of the variation sensed in the input voltage VIN. The disclosed voltage sensing circuit 100 is operable to sense variation of the input voltage VIN regardless of whether the voltage VIN is rising or falling and without regard to the DC value of the input voltage VIN.

The components comprising the respective start-up circuitry 110, sensing circuitry 130, output circuitry 150, and logic circuitry 170 are briefly described in the following paragraphs with reference to the circuit 100 illustrated in FIG. 1, wherein the operation of the circuit 100 is described in greater detail thereafter. The start-up circuitry 110 includes a first current mirror 112 comprised of transistors MS4 and MS5. Transistor MS5 is coupled to a current sink (not shown) at a biasing node 113 to provide a biasing current $I_{Bias}$ from transistor MS5. Transistor MS4 may be sized to transistor MS5 to set a mirrored bias current $I_{Bias}'$, which is supplied to node 115. The current supplied to node 115 produces a voltage VA1 for turning on acceleration circuitry 116. The acceleration circuitry 116 is comprised of series-connected transistors MR1, MR2, MR3, and MR4. The voltage VA1 is applied to the gates of the respective transistors MR1, MR2, MR3, and MR4. Accordingly, the bias current $I_{Bias}$ from transistor MS5 should be great enough to generate a voltage VA1 large enough to turn on transistors MR1-MR4, thus activating the acceleration circuitry 116. When activated, the acceleration circuitry 116 supplies a current $I_A$ at node 120 to supply additional current to accelerate response of the sensing circuitry 130, as further explained below. In an example embodiment of the circuit 100, $I_{Bias}$=2.5 uA, (W/L)$_{MS5}$=(10 u/5 u)*2, (W/L)$_{MS4}$=(10 u/5 u)*2, and the combined size of transistors MR1 through MR4 may be represented as (W/L)$_{MR1-MR4}$=(1 u/35 u).

The circuit 100 further includes a second current mirror 114 comprised of transistors MS2 and MS3, wherein the drain of transistor MS3 is coupled to node 115, and the drain of transistor MS2 is coupled to a transistor MS1. Transistor MS1 is responsive to the voltage at node 120 to control a current $I_{MS2}$ at transistor MS2, wherein transistor MS2 may be sized to transistor MS3 to set current $I_{MS3}$, which is drawn from node 115. At start-up, the transistor MS1 is turned off, which results in a low $I_{MS3}$. When the voltage at node 120 produces a $V_{GS}$ voltage greater than the threshold voltage of transistor MS1, transistor MS1 is activated and the current $I_{MS3}$ is drawn from the node 115. Accordingly, the current $I_{Bias}'$ should be large enough to provide sufficient voltage VA1 to activate the acceleration circuitry 116 when transistor MS1 is initially off at start-up, and to maintain activation of the acceleration circuitry 116 thereafter. Therefore, after start-up of the circuit 100, the acceleration circuitry 116 will continue to draw current from node 120. In an example embodiment of the circuit 100 illustrated in FIG. 1, (W/L)$_{MS3}$=(10 u/5 u)*2, (W/L)$_{MS2}$=(10 u/5 u)*2, and (W/L)$_{MS1}$=(10 u/5 u)*10.

As illustrated in FIG. 1, the sensing circuitry 130 comprises transistors M1, M2, M3, and M4, resistor R1, and a sensing capacitor CS1 coupled to the input node IN. The sensing capacitor CS1 blocks the DC component of the input voltage VIN applied to the input node IN, and passes variation of the input voltage VIN to the circuit 100 as voltage VCS1. In accordance with the present disclosure, the sensing circuit 130 has two operating states. The first operating state (i.e., the quiescent state) occurs when there is no variation in the input voltage VIN. In this quiescent state, an initial sensing capacitor voltage VCS1 is applied to transistors M1-M4 and substantially no additional current is applied to transistors M1-M4 from the input node IN. The second operating state occurs when there is a variation in the input voltage VIN and a corresponding change in the voltage VCS1 causes a change in the current flowing through transistors M1-M4. In accordance with an embodiment of the present disclosure, when the sensing capacitor CS1 senses a positive change, or increase, in the input voltage VIN, the currents across respective transistors M1-M4 increase. When the sensing capacitor CS1 senses a negative change, or decrease, in the input voltage VIN, the currents across respective transistors M1-M4 decrease.

Transistors M2 and M4 are coupled together to form a first leg of the sensing circuitry 130, wherein the sensing capacitor CS1 is coupled to a node located between the drain of transistor M2 and the drain of transistor M4 as illustrated in FIG. 1. Additionally, transistor M2 is coupled to transistors M5 and M11 to form a third current mirror 132, and transistor M4 is coupled to transistors M3, M6, M9, and MS1 to form a fourth current mirror 134, wherein the fourth current mirror 134 is coupled to node 120 at the drain of transistor M3 and the gate of transistor MS1.

Transistors M1 and M3 are coupled together to form a second leg of the sensing circuitry 130. The drain of transistor M1 is coupled to node 120 which, as previously mentioned, is coupled to the acceleration circuitry 116 and to the gate of transistor MS1. The gate of transistor M1 is coupled to the gate of transistor M2, and the source of transistor M1 is coupled to resistor R1. Resistor R1 sets the current across transistor M1 ($I_{M1}$), which is reflected about the third and fourth current mirrors 132 and 134. Accordingly, the resistor R1 regulates the DC current of transistors M1-M4 to provide a quiescent state current at each of the transistors M1-M4. In the embodiment illustrated in FIG. 1, the resistor R1 regulates the current of transistors M1-M4 such that a change in current across transistor M2 is greater than a change in current across transistor M3 (i.e., $\Delta I_{M2} > \Delta I_{M3}$). It should be appreciated that, in other embodiments, the resistor R1 may alternatively be coupled to other components such as, for example, the source of transistor M4. In an example embodiment of the circuit 100 illustrated in FIG. 1, CS1=16 pF, R1=120 kOhms, (W/L)$_{M1}$=(10 u/5 u)*14, (W/L)$_{M2}$=(10 u/5 u)*8, (W/L)$_{M3}$=(10 u/5 u)*10, and (W/L)$_{M4}$=(10 u/5 u)*10.

The output circuitry 150 includes a fifth current mirror 152 comprised of transistors M7 and M8, a sixth current mirror 154 comprised of transistors M10 and M12, transistors M6 and M9 (which are included in the fourth current mirror 134), transistors M5 and M11 (which are included in the third current mirror 132), the first output node OUT1, and the second output node OUT2. The drain of transistor M5 is coupled to the drain of transistor M6 at the first output node OUT1. In the embodiment illustrated in FIG. 1, the size of transistor M6 is equal to the size of transistor M4 (e.g., (W/L)$_{M6}$=(W/L)$_{M4}$=(10 u/5 u)*10), the size of transistor M2 is larger than the size of transistor M5 (e.g., (W/L)$_{M2}$=(10 u/5 u)*8 and (W/L)$_{M5}$=(10 u/5 u)*6), and the size of transistor M4 is larger than the size of transistor M9 (e.g., (W/L)$_{M4}$=(10 u/5 u)*10 and (W/L)$_{M9}$=(10 u/5 u)*8). During the quiescent state, $I_{M3}=I_{M4}=I_{M2}$, and the current across M6 ($I_{M6}$) is driven higher than the current across M5 ($I_{M5}$), thereby driving the state of the first output node OUT1 high during the quiescent state.

The drain of transistor M9 is coupled to the fifth current mirror 152 at the drain and gate of transistor M7, wherein transistor M7 may be sized to transistor M8 to set current $I_{M8}$. The drain of transistor M11 is coupled to the sixth current mirror 154 at the drain and gate of transistor M12, wherein transistor M12 may be sized to transistor M10 to set current $I_{M10}$. The second output node OUT2 is coupled between transistor M8 of the fifth current mirror 152 and transistor M10 of the sixth current mirror 154. During the quiescent state, the current across transistor M11 ($I_{M11}$) is greater than the current across transistor M9 ($I_{M9}$). Therefore, during the quiescent state, $I_{M10}$ drives the state of the second output node OUT2 high. In an example embodiment of the circuit 100 illustrated in FIG. 1, $(W/L)_{M7}$=(10 u/5 u)*4, $(W/L)_{M8}$=(10 u/5 u)*4, $(W/L)_{M10}$=(10 u/5 u)*4, $(W/L)_{M11}$=(10 u/5 u)*8, and $(W/L)_{M12}$=(10 u/5 u)*4.

As shown in FIG. 1, the logic circuitry 170 comprises a NAND gate 172 having inputs coupled to respective output nodes OUT1 and OUT2, and producing an active high output logic signal OUTZ. As described in greater detail below, the output logic signal OUTZ is provided to indicate the occurrence of a variation or transition of the input voltage VIN applied at the input node IN. Although a NAND gate producing an active high output signal is provided in the embodiment described herein, it should be understood that alternative embodiments may comprise other circuitry that may be active high or low without departing from the spirit and scope of the present disclosure as set forth in the claims provided below.

Figure 2:
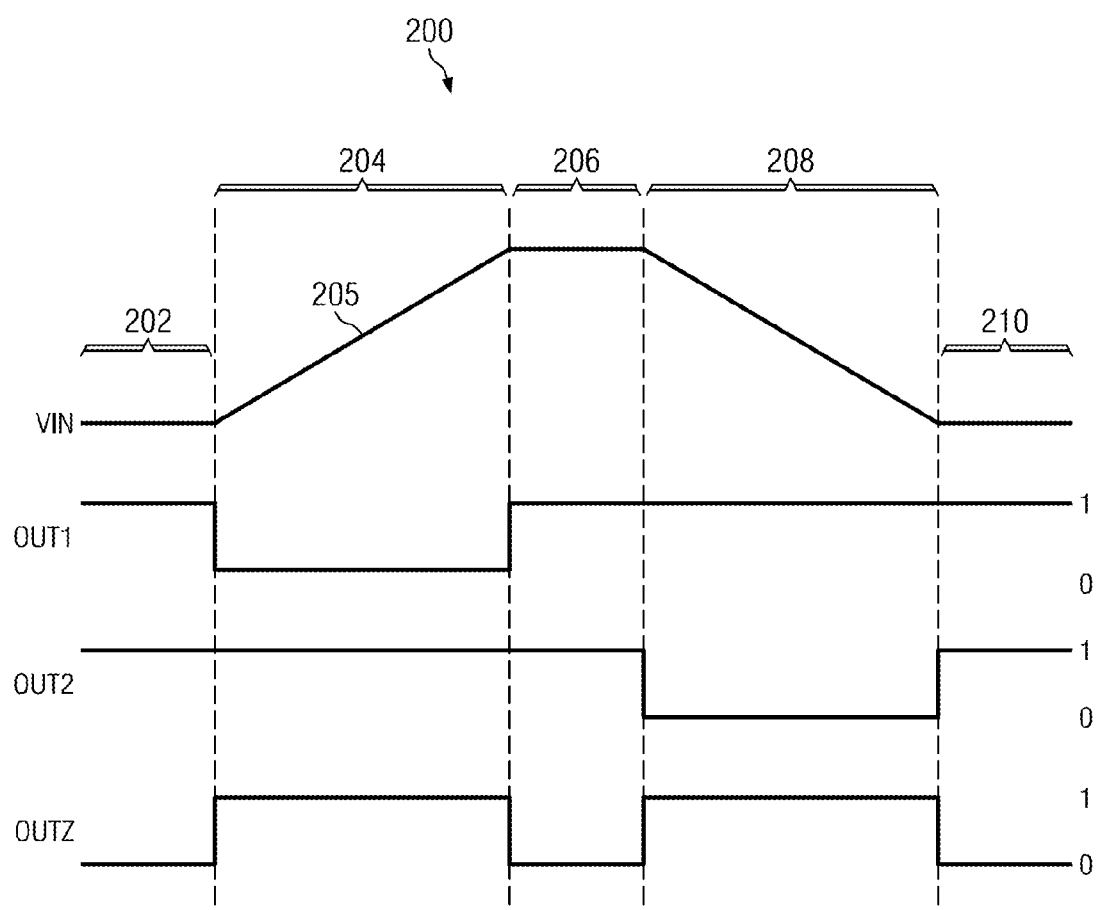
FIG. 2 illustrates a timing diagram corresponding to the disclosed bidirectional voltage differentiator circuit illustrated in FIG. 1.

Operation of the circuit 100 is now described in greater detail with reference to both the circuit 100 illustrated in FIG. 1 and the corresponding timing diagram 200 illustrated in FIG. 2. The timing diagram 200 illustrates operation of the circuit 100 by providing logic states of the OUT1, OUT2, and OUTZ signals in response to an example VIN signal 205. The timing diagram 200 shows a first stage 202 wherein the voltage VIN is low with no variation, a second stage 204 wherein VIN is increasing, a third stage 206 wherein VIN is high with no variation, a fourth stage 208 wherein VIN is decreasing, and a fifth stage 210 wherein VIN is low with no variation.

During the first stage 202, the voltage VIN is low with no variation and the circuit 100 is in the quiescent state. During the quiescent state, both the first output node OUT1 and the second output node OUT2 are high, therefore, the output logic signal OUTZ is low.

During the second stage 204, the voltage VIN increases (i.e., changes from a lower voltage to a higher voltage). The sense capacitor CS1 senses the variation in the voltage VIN, which causes a corresponding change in the current across respective transistors M1-M4. As the voltage VIN increases, the currents across transistors M2 ($I_{M2}$) and M3 ($I_{M3}$) increase. The change in current across M2 is larger than the change in current across M3 (i.e., $\Delta I_{M2} > \Delta I_{M3}$), and the current across transistor M5 ($I_{M5}$) becomes greater than the current across transistor M6 ($I_{M6}$), which pulls output node OUT1 low. Therefore, as the voltage VIN transitions from low to high, OUT1 goes low while OUT2 remains high, thus causing OUTZ to go high during the second stage 204.

During the third stage 206, the voltage VIN remains high with no variation. Accordingly, $I_{M6}$ again becomes greater than $I_{M5}$, and the circuit 100 returns to the quiescent state. Since there is no variation of VIN during the third stage 206, OUT1 returns to a high state, and OUTZ returns to a low state.

During the fourth stage 208, the voltage VIN decreases (i.e., changes from a higher voltage to a lower voltage). As the voltage VIN decreases, $I_{M2}$ and $I_{M3}$ decrease. The change in $I_{M2}$ is greater than the change in $I_{M3}$, and the current across transistor M8 ($I_{M8}$) becomes larger than the current across transistor M10 ($I_{M10}$), which pulls output node OUT2 low. Therefore, as the voltage VIN transitions from high to low, OUT2 goes low while OUT1 remains high, thus causing OUTZ to go high during the fourth stage 208.

During the fifth stage 210, the voltage VIN remains low with no variation. As further described below, the acceleration circuitry 116 accelerates the recovery of the sensing circuitry 130, and the circuit 100 again returns to the quiescent state. Accordingly, OUT2 returns to a high state, and OUTZ returns to a low state. As illustrated in FIG. 2, the OUTZ signal is low when there is no variation of the voltage VIN on the input node IN, and is high when the voltage VIN is varying or transitioning, regardless of the DC value of the voltage on IN. Thus, the logic output signal OUTZ may be used to indicate the occurrence of a variation of the input voltage VIN.

Recovery of the sensing circuitry 130 is further described herein with reference to the start-up circuitry 110 and sensing circuitry 130 illustrated in FIG. 1. As previously mentioned, the start-up circuitry 110 is operable to start-up the sensing circuitry 130 (in a current-sensing mode) once the circuit 100 is powered on, and is further operable to accelerate the response of the sensing circuitry 130 thereafter. As the voltage VIN on the input node IN decreases (see e.g., fourth stage 208 in FIG. 2), current flows out of the input node IN, thus causing the voltage VCS1 to decrease. As VCS1 decreases, $I_{M2}$ and $I_{M3}$ decrease, which causes $I_{M8}$ to become greater than $I_{M10}$ and pulls OUT2 low as described above. Once the voltage VIN has finished decreasing, no current flows from the input node IN. At this point, $I_{M3}$ and $I_{M4}$ try to recharge the capacitor CS1 at the current set by transistor M1 to drive the voltage VCS1 back to its quiescent state, which also drives OUT2 from low to high. However, since the capacitor CS1 may be relatively large, this recovery may be slow and the transition of OUT2 from low to high may be significantly delayed. The delayed transition of OUT2 results in a delayed change in the logic output signal OUTZ, wherein during this delayed transition period, the logic output signal OUTZ is incorrectly indicating a voltage variation at the input node IN. Therefore, in order to accelerate the recovery of the capacitor CS1 and voltage VCS1, the start-up circuitry 110 uses acceleration circuitry 116 to increase the currents across resistors M3 and M4 ($I_{M3}$ and $I_{M4}$, respectively) to charge capacitor CS1 and thereby decrease the recovery time. By decreasing the recovery time, the start-up circuitry 110 reduces the delay from when the input voltage VIN stops decreasing and the second output node OUT2 returns to its quiescent state. Thus, the duration of the incorrect output of the logic output signal OUTZ is significantly reduced.

In order to accelerate the recovery of sensing capacitor CS1, the acceleration circuitry 116 draws additional current $I_A$ from node 120. The additional current $I_A$ is mirrored by the fourth current mirror 134, which causes $I_{M3}$ and $I_{M4}$ to supply additional current to the sensing capacitor CS1, thereby accelerating the charging of CS1 and reducing the time required for VCS1 to reach its quiescent state.

Figure 3:
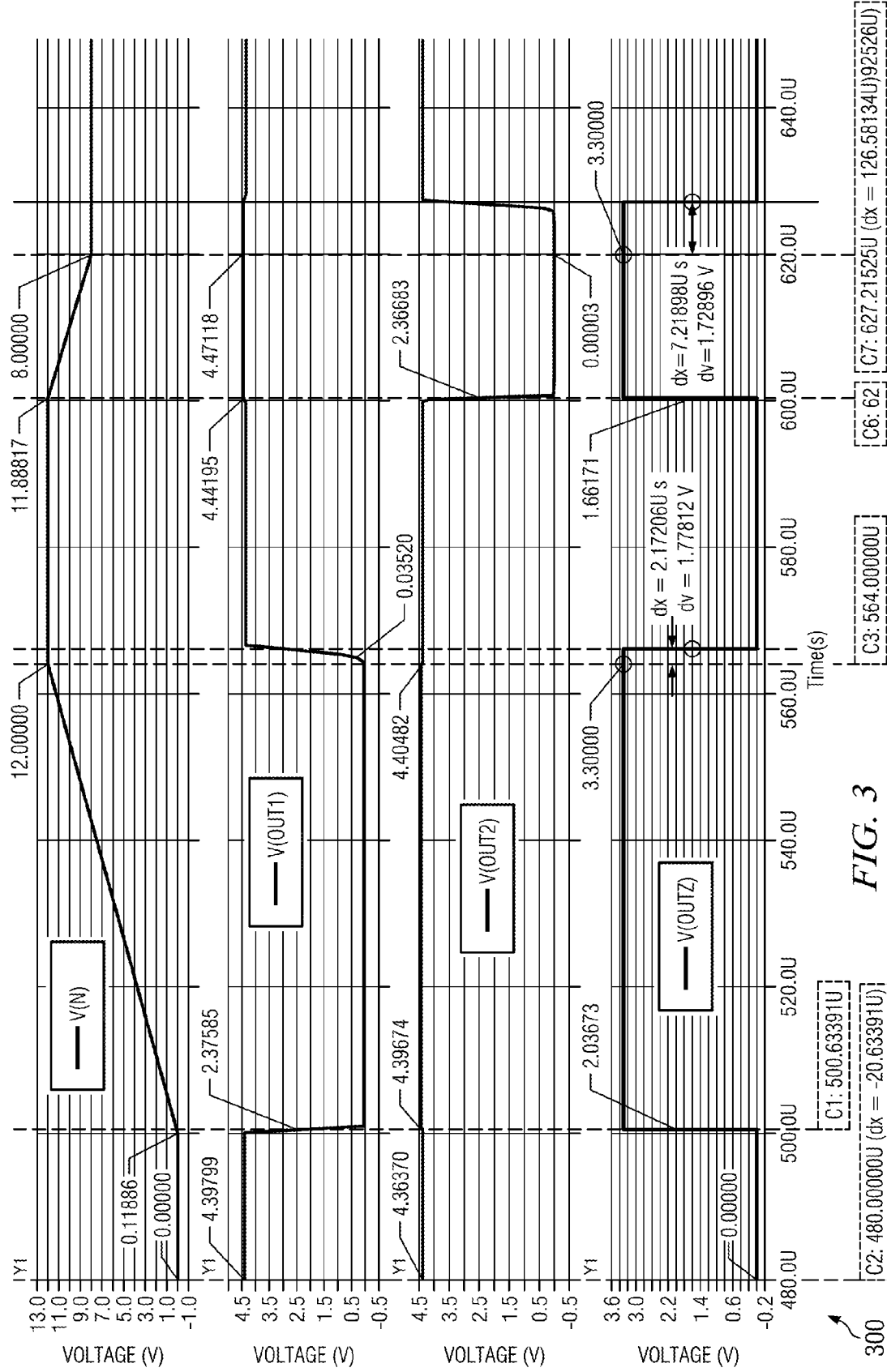
FIG. 3 illustrates simulation results for the bidirectional voltage differentiator circuit shown in FIG. 1.

Operation of the disclosed bidirectional voltage differentiator circuit 100, including the acceleration functionality, is further illustrated by the simulation results 300 illustrated in FIG. 3. In the simulation shown in FIG. 3, VIN increases from zero to 12V with a 64 us rising time and decreases from 12V to 8V with a 20 us falling time. In general, when VIN is increasing or decreasing, OUTZ is logic high, and when VIN is constant, OUTZ is logic low. As shown in FIG. 3, the logic output signal OUTZ changes states when the input voltage varies by approximately 0.12V. Additionally, after VIN increases, the falling OUTZ signal is delayed by approximately 2 us while OUT1 returns to its quiescent state, and after VIN decreases, the falling OUTZ signal is delayed by approximately 7 us while OUT2 returns to its quiescent state.

Figure 4A:
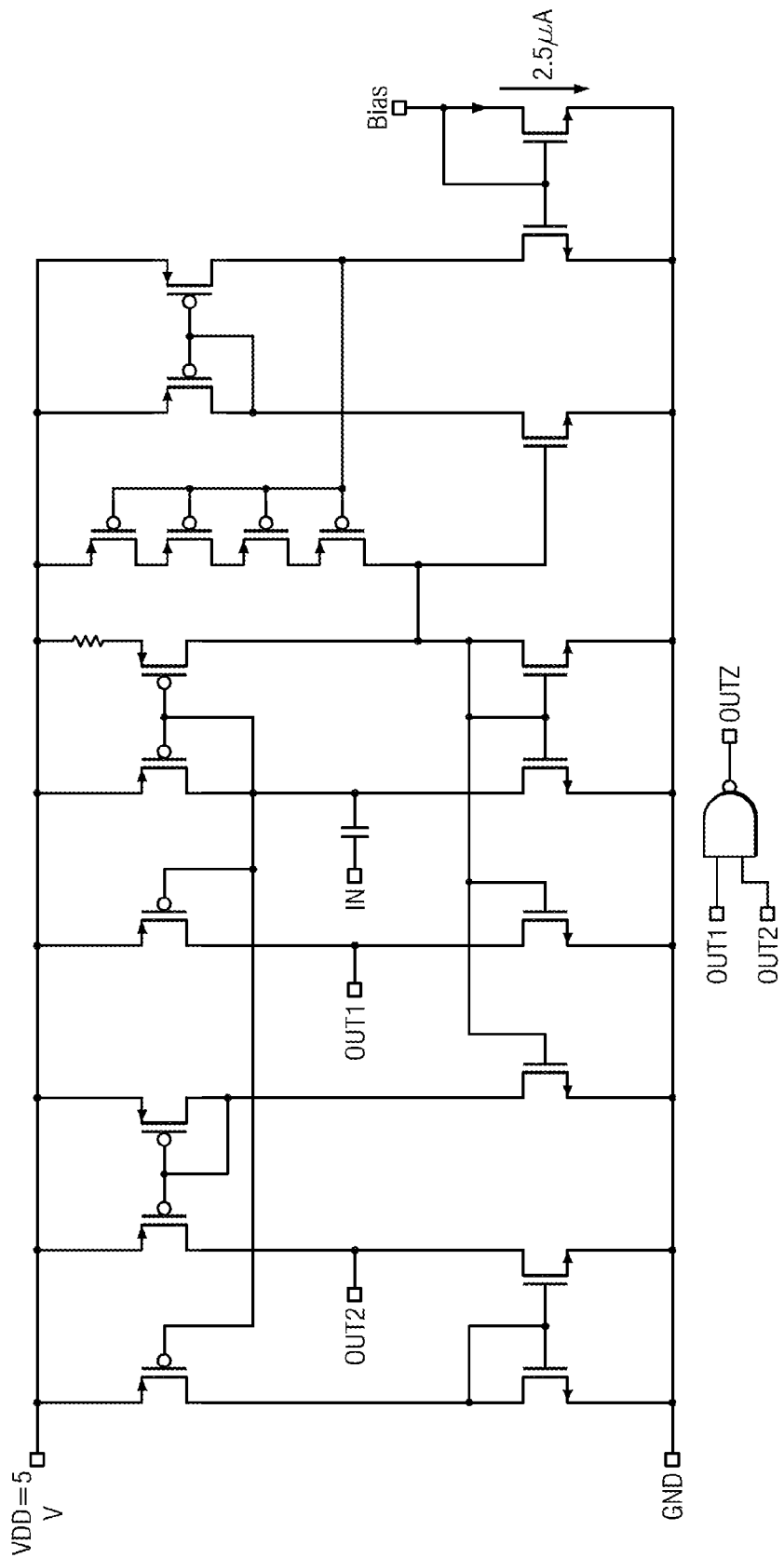
FIGS. 4A and 4B illustrate additional example embodiments of a bidirectional voltage differentiator circuit in accordance with the present disclosure.
Figure 4B:
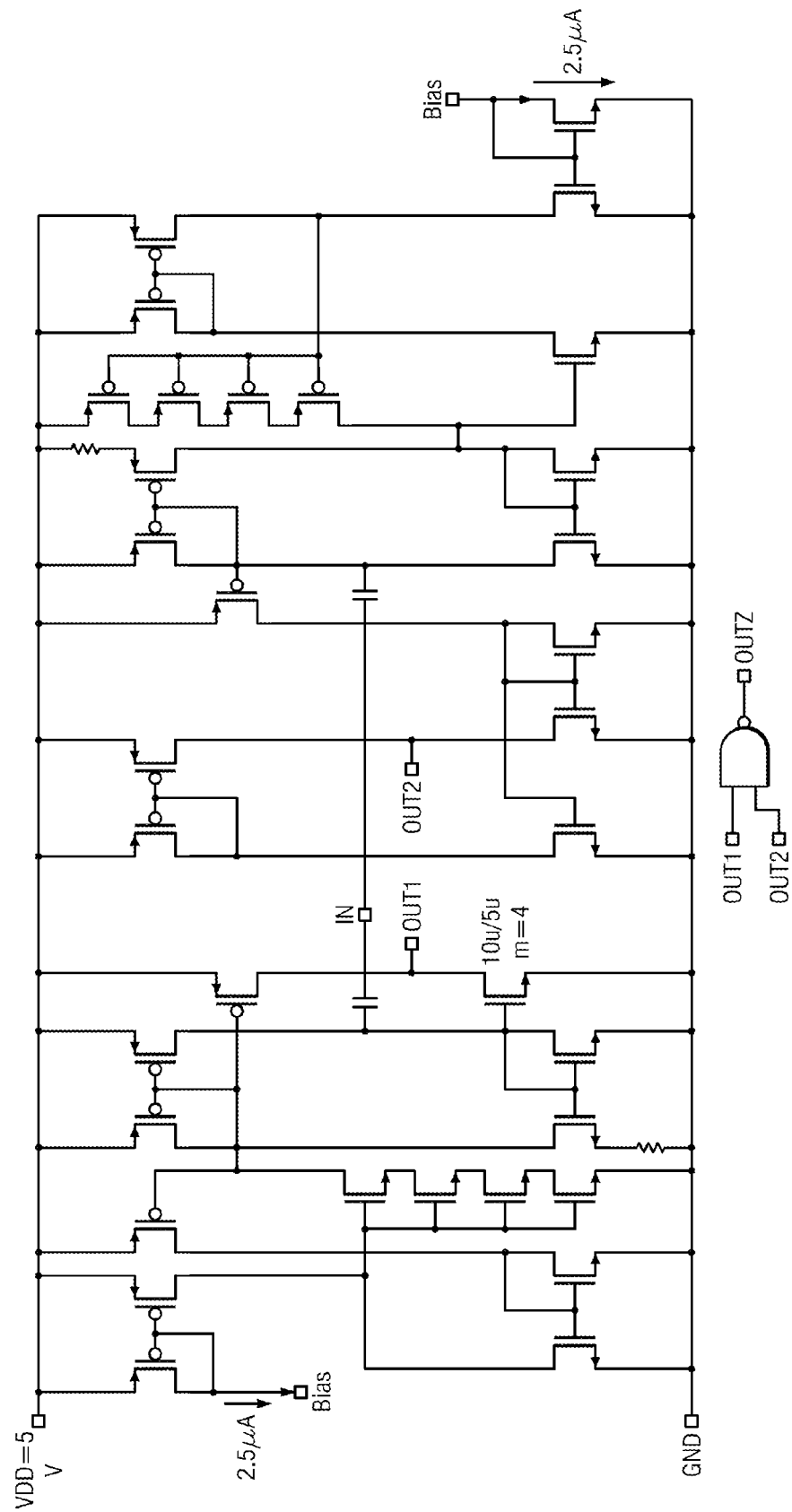

It should be appreciated by one of ordinary skill in the art that the embodiment disclosed herein is provided to illustrate one example for implementing a bidirectional voltage differentiator circuit in accordance with the present disclosure. As such, variations to the circuit illustrated in FIG. 1 may be made without departing from the spirit or scope of the present disclosure as set forth in the claims provided below. For example, FIGS. 4A and 4B illustrate additional implementations of the disclosed bidirectional voltage differentiator circuit.

Figure 5:
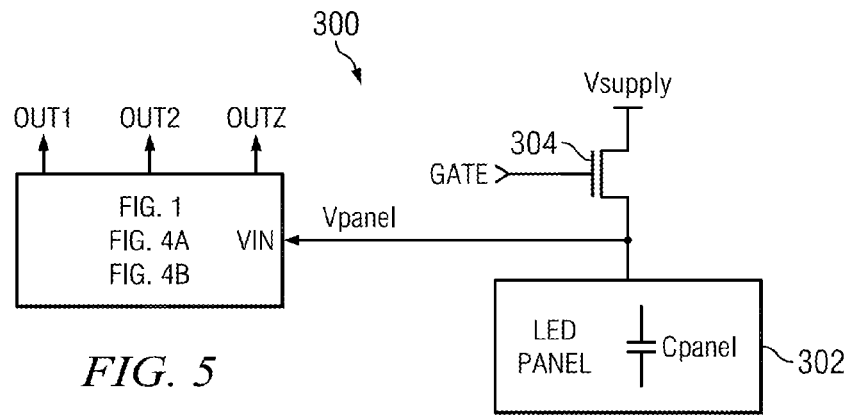
FIG. 5 illustrates an application of the bidirectional voltage differentiator circuit to sense voltage of an LED panel.

Reference is now made to FIG. 5 which illustrates an application of the bidirectional voltage differentiator circuit (FIG. 1, 4A or 4B) to sense voltage of an LED panel. A circuit 300 for use with an LED panel 302 (such as an AMOLED (active-matrix organic light-emitting diode) panel known to those skilled in the art) comprises a power MOSFET 304 having a drain terminal coupled to a supply voltage Vsupply. The MOSFET 304 includes a gate terminal coupled to receive a control signal. The source terminal of the MOSFET 304 produces a panel voltage Vpanel and is coupled to the LED panel 302 (which those skilled in the art will recognize has an associated panel capacitance Cpanel).

It is important in operation of the LED panel 302 to determine the finish of power transmission. This occurs, for example, when the panel voltage Vpanel equals the supply voltage Vsupply, or when the panel voltage Vpanel equal some other known voltage. Prior art configurations inserted a sense resistor between the panel voltage Vpanel node and the source terminal of the MOSFET 304 in order to sense current flow to/from the panel. However, with an AMOLED panel there is a large current in the power MOSFET 304 which makes it difficult to add the prior art sense resistor configuration.

The bidirectional voltage differentiator circuit, in any of the implementations discussed above in FIGS. 1, 4A and 4B, can be advantageously used to sense voltage of the LED panel. The VIN input node of the bidirectional voltage differentiator circuit is coupled to the source terminal of the MOSFET 304 which produces the panel voltage Vpanel. Thus, VIN will equal Vpanel. The state transitions of the OUT1, OUIT2 and OUTZ signals will then provide information indicative of the turning on of the MOSFET 304, power transmission to/from the panel 302, and finish of power transmission with respect to the panel 302.

Figure 6:
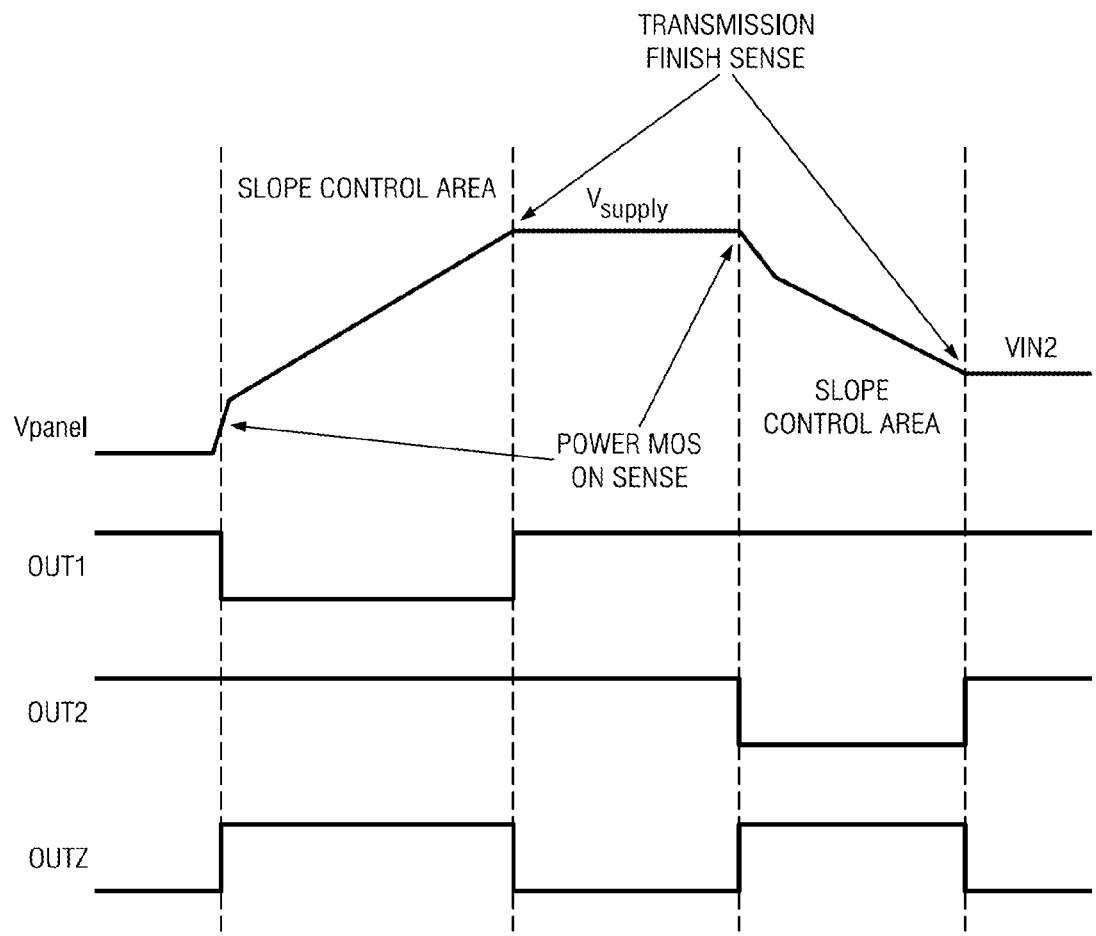
FIG. 6 illustrates a waveform for a typical panel voltage Vpanel in an AMOLED panel and a timing diagram for the logic states of the output signals for the bidirectional voltage differentiator circuit.

Reference is now made to FIG. 6 which illustrates a waveform for a typical panel voltage Vpanel in an AMO-LED panel and the timing diagram for logic states of the output signals for the bidirectional voltage differentiator circuit. As discussed above, the bidirectional voltage differentiator circuit operates as a slope detector. The OUT1 signal transitions from a first logic state to a second logic state in response to an increase in voltage at the input VIN (positive slope detection), and transitions from the second logic state to the first logic state in response to termination of voltage increase. Thus, where VIN=Vpanel, a transition of the OUT1 signal from the first logic state to the second logic state indicates an increase in the panel voltage Vpanel, while a transition in the OUT1 signal from the second logic state to the first logic state indicates that the increase in panel voltage has terminated. In an AMOLED panel configuration with MOSFET 304, the transition of the OUT1 signal from the first logic state to the second logic state accordingly indicates the start of power transmission to the panel, while the transition in the OUT1 signal from the second logic state to the first logic state indicates the finish of power transmission to the panel, such as when Vpanel=Vsupply. The OUTZ signal will accordingly transition from the second logic state to the first logic state at the beginning of power transmission to the panel, and transition from the first logic state to the second logic state at the finish of power transmission to the panel.

The foregoing describes operation in connection with a power transmission with a positive slope. FIG. 6 further illustrates that the bidirectional voltage differentiator circuit will also operate to make power transmission detection when the power transition has a negative slope. The OUT2 signal transitions from a first logic state to a second logic state in response to a decrease in voltage at the input VIN (negative slope detection), and transitions from the second logic state to the first logic state in response to termination of voltage decrease. Thus, where VIN=Vpanel, a transition of the OUT2 signal from the first logic state to the second logic state indicates a decrease in the panel voltage Vpanel, while a transition in the OUT2 signal from the second logic state to the first logic state indicates that the decrease in panel voltage has terminated. In an AMOLED panel configuration with MOSFET 304, the transition of the OUT2 signal from the first logic state to the second logic state accordingly indicates the start of power transmission from the panel, while the transition in the OUT2 signal from the second logic state to the first logic state indicates the finish of power transmission from the panel, such as when Vpanel=VIN2. The OUTZ signal will accordingly transition from the second logic state to the first logic state at the beginning of power transmission from the panel, and transition from the first logic state to the second logic state at the finish of power transmission from the panel.

When there is no variation in panel voltage Vpanel, the OUTZ signal is stays at the second logic level. The OUTZ signal can thus be used to trigger detection of power transmission completion. However, during any variation in panel voltage (positive or negative, and indicative of power transmission with respect to the panel), the OUTZ signal transitions to the first logic level and stays at the first logic level for as long as panel voltage variation (power transmission) continues. The OUTZ signal can thus be used to trigger slope control operations for the panel. Specifically, when the OUTZ signal transitions to the first logic level (indicative of a sensed slope change at the VIN node), this logic state can be detected by a control circuit for the panel and used to trigger actions taken to control the rate of change (i.e., a slope control mode of operation).

What is claimed is:

1. A circuit for controlling operation of a display including an LED panel and a drive transistor that is configured to provide a supply voltage for the LED panel, comprising:
   a detection circuit coupled to receive the supply voltage and configured to sense a first slope change in said supply voltage and set a first logic signal in an active logic state starting with and lasting for a duration of said first slope change and configured to sense a second slope change in said supply voltage and set a second logic signal in an active logic state starting with and lasting for a duration of said second slope change; and
   an output circuit configured to generate an output signal, in response to the active logic state of either the first logic signal or the second logic signal, that is indicative of said detection circuit sensing either the first or second slope change in said supply voltage.

2. The circuit of claim 1, wherein said first slope change is an increase in said supply voltage, the circuit further configured to perform slope control of the supply voltage until said supply voltage increases to a high voltage level.

3. The circuit of claim 2, further comprising a third slope change corresponding to said slope control, said detection circuit configured to maintain the set active logic state of the first logic signal for a duration of said third slope change.

4. The circuit of claim 2, wherein said change in state of the first logic signal is indicative of a start of drive transistor power transmission to the LED panel.

5. The circuit of claim 1, wherein said second slope change is a decrease in said supply voltage, the circuit further configured to perform slope control of the supply voltage until said supply voltage decreases to a low voltage level.

6. The circuit of claim 5, further comprising a third slope change corresponding to said slope control, said detection circuit configured to maintain the set active logic state of the second logic signal for a duration of said third slope change.

7. The circuit of claim 5, wherein said change in state of the second logic signal is indicative of a finish of drive transistor power transmission to the LED panel.

8. The circuit of claim 1, wherein said detection circuit includes a blocking circuit configured to block a DC component of said supply voltage.

9. The circuit of claim 1, wherein the first and second logic signals are set in an inactive logic state responsive to there being no slope change in said supply voltage, and wherein said detection circuit further includes a recovery circuit configured to reduce a recovery time of said sense circuit after said sense circuit senses said second change in said supply voltage to support setting of the inactive logic state.

10. The circuit of claim 9, wherein said recovery circuit comprises acceleration circuitry operable to produce a charging current applied to a capacitor of said sense circuitry.

11. The circuit of claim 10, wherein said acceleration circuitry comprises a plurality of series connected transistors.

12. The circuit of claim 10, wherein said recovery circuit is operable to reduce a delay time of said output signal responding to said inactive logic state.

13. The circuit of claim 1, wherein said detection circuit comprises a first transistor coupled in series with a second transistor, wherein a current across said first transistor becomes greater than a current across said second transistor when said detection circuit senses said first slope change in said supply voltage.

14. The circuit of claim 13, wherein said first logic signal is set in the active logic state responsive to said current across said first transistor being greater than said current across said second transistor.

15. The circuit of claim 1, wherein said detection circuit comprises a first transistor coupled in series with a second transistor, wherein a current across said first transistor becomes greater than a current across said second transistor when said detection circuit senses said second slope change in said supply voltage.

16. The circuit of claim 15, wherein said second logic signal is set in the active logic state responsive to said current across said first transistor being greater than said current across said second transistor.

17. The circuit of claim 1, wherein said detection circuit comprises a capacitor coupled between a first current mirror and a second current mirror.

18. The circuit of claim 1, wherein a logic state of said third signal is indicative of sensing power transmission by the drive transistor to the LED panel.

19. The circuit of claim 1, wherein the detection circuit comprises:
a voltage differentiator circuit operable to sense and respond to said first slope change in the supply voltage by increasing current applied to first circuitry operable to generate a state change for setting the active logic state of the first logic signal, and further operable to sense and respond to said second slope change in said supply voltage by decreasing said current applied to said first circuitry.

20. The circuit of claim 19, wherein said first circuitry comprises a first current mirror operable, in response to said increase of said current, to generate said state change of said first logic signal.

21. The circuit of claim 20, wherein said first current mirror comprises a first transistor operable, in response to said increase of said current, to pull said first logic signal to the active logic state of logic low.

22. The circuit of claim 20, wherein said first circuitry further comprises a second current mirror operable, in response to said decrease of said current, to generate a state change for setting the active logic state of said second logic signal.

23. The circuit of claim 22, wherein said second current mirror comprises a second transistor operable to pull said first logic signal to an inactive logic state of logic high.

24. The circuit of claim 22, wherein said second current mirror comprises a third transistor operable, in response to said decrease of said current, to control a third current mirror to pull said second logic signal to the active logic state of logic low.

25. The circuit of claim 22, wherein said voltage differentiator circuit further comprises a capacitor coupled between said first current mirror and said second current mirror, said capacitor operable to block a DC component of said supply voltage.

26. The circuit of claim 20, wherein said first current mirror further comprises a fourth transistor operable to control a fourth current mirror to pull said second output signal to an inactive logic state of logic high.

27. The circuit of claim 19, wherein said voltage differentiator circuit further comprises a biasing transistor coupled in series with a resistor.

28. The circuit of claim 19, further comprising a recovery circuit operable to reduce recovery time of said voltage differentiator circuit after said voltage differentiator circuit senses said change in said supply voltage.

29. The circuit of claim 28, wherein said recovery circuit comprises a plurality of series connected transistors.

30. The circuit of claim 1, implemented as an integrated circuit.

* * * * *